United States Patent [19]

Craiglow

[11] Patent Number: 4,551,688
[45] Date of Patent: Nov. 5, 1985

[54] DELAY COMPENSATED AUTOMATIC GAIN CONTROL

[75] Inventor: Robert L. Craiglow, Cedar Rapids, Iowa

[73] Assignee: Rockwell International Corporation, El Segundo, Calif.

[21] Appl. No.: 613,661

[22] Filed: May 23, 1984

[51] Int. Cl.[4] .............................................. H03G 3/10
[52] U.S. Cl. .................................... 330/280; 330/278
[58] Field of Search ............... 330/138, 141, 278, 280, 330/279

[56] References Cited

FOREIGN PATENT DOCUMENTS 87223 5/1982 Japan ................................... 330/279

Primary Examiner—James B. Mullins
Assistant Examiner—G. Wan
Attorney, Agent, or Firm—George A. Montanye; H. Fredrick Hamann

[57] ABSTRACT

There is disclosed a delay compensated automatic gain control which allows improved automatic gain control in analog and digitally implemented systems. The AGC system and technique includes a primary high speed control loop implemented after the intermediate frequency filtering and a secondary loop which controls the radio frequency gain prior to the intermediate frequency filter without affecting the overall response of the automatic gain control system. The resulting action of the two loops provides an automatic gain control for the radio frequency and intermediate frequency stages in both analog and digitally implemented systems without sacrificing speed of response or stability of the systems.

11 Claims, 4 Drawing Figures

DELAY COMPENSATED AUTOMATIC GAIN CONTROL

BACKGROUND OF THE INVENTION

The present invention relates to analog and digital control circuitry and more particularly to an automatic gain control (AGC) for use with analog and digitally implemented receiving systems.

There are known in the prior art a variety of automatic gain control systems which are useful in the construction and operation of gain control in analog receivers. While such AGC control circuits have been successful in improving the operation of such receivers, there are situations in which the specific constructions of the analog or digitally implemented receivers are limited in operation by the specific configuration of the automatic gain control circuits. In addition, while an AGC provides the same functions in both an analog and digitally implemented system, there are significant differences (because of the differences in hardware) in the approach that must be used in the construction of such AGC circuits.

By way of example, in conventional analog systems, the response time and other characteristics of an AGC circuit can be improved by use of a log envelope detector. Such circuits are well-known in the art as exemplified by U.S. Pat. No. 4,263,560, and have been used successfully in analog circuits to control the gain of a variable gain amplifier receiving an analog RF input. In such analog systems, however, the overall cost of the analog radio as a result of the use of such log detectors is increased and has thus only been used where cost is not of great concern. Nevertheless, the log envelope detection technique of the type referenced above has applicability to both analog and digitally implemented systems because of the corresponding functional similarities in both systems.

In the presently-evolving trend toward implementation of high frequency receivers with a mixture of analog and digital techniques to optimize signal processing, similar control circuits (including the AGC control) may be implemented in a digital format. In moving to such corresponding digital control, conventional digital techniques are utilized to produce the desired automatic gain control. One of the benefits in implementing the digital AGC is that it is more economical to convert the signal level representations needed for log envelope detection in a digital environment to enable the production of a linear AGC using the techniques of the type referenced in U.S. Pat. No. 4,263,560. Accordingly, HF receivers employing a combination of analog and digital techniques are evolving which allow improved signal processing and the implementation of conventional techniques which have heretofore been unacceptable because of cost considerations.

While such analog/digital hybrid receivers have improved performance, the necessity for an A/D converter in going from an analog receiver to digital processing results in a requirement of more gain before the digital IF filter in the receiver. This means that appreciable AGC must be applied before the narrowband digital IF filter so that the A/D converter can operate satisfactorily. Accordingly, because of the envelope delay associated with such a narrow band filter prior to the log envelope detection, special techniques must be employed to provide the AGC with adequate speed while still controlling overshoot for proper operation.

The same envelope delay in the IF filter of a totally analog system can also be overcome with those special techniques in order to improve the operation of a purely analog system.

Accordingly, the present invention has been developed to overcome the shortcomings of the above known and similar techniques and to provide an improved automatic gain control circuit for analog and digitally implemented circuits.

SUMMARY OF THE INVENTION

In accordance with the present invention, an AGC circuit is constructed which includes two control loops. The primary control loop is a high speed control loop positioned in a receiving system after an intermediate frequency filter to provide the primary AGC control. The secondary loop is an automatic gain control loop using the feedback from the intermediate frequency output following the IF filter to control the gain of the radio frequency amplifier. The secondary loop interacts with the primary loop to produce a signal which is subtracted in the primary control loop to compensate for the filter delay. The two loop construction lessens the effect of long delays caused by intermediate frequency filters in both digitally and analog implemented receiving systems, thereby improving response time and reducing overshoot without sacrificing the speed of response or stability of the system.

It is therefore a feature of the invention to provide an AGC circuit for providing improved control.

It is a further feature of the invention to provide an AGC circuit for use with intermediate frequency filters for reducing the effects of delays caused by the intermediate frequency filters.

It is still another feature of the invention to provide a linear AGC control system for use in analog and digitally implemented receiving systems for reducing the effect of intermediate frequency filter delays on AGC control.

Yet another feature of the invention is to provide an HF receiver AGC control which provides two AGC control loops for improving the operation and response of the AGC without substantially influencing the speed of response or stability of AGC control.

Still a further feature of the invention is to provide an AGC control which is useful with the signal requirements of an A/D converter in a digitally implemented receiving system.

These and other objects, advantages and novel features of the invention will become apparent from the following detailed description when considered with the accompanying drawings wherein:

DETAILED DESCRIPTION OF PREFERRED EMBODIMENTS

Figure 1:
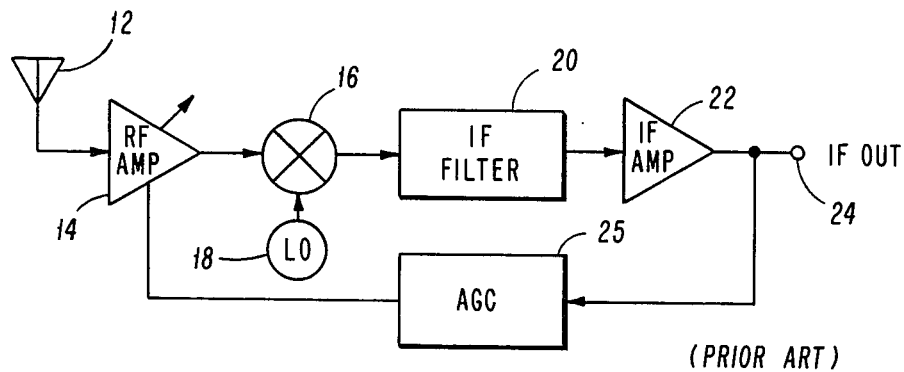
FIG. 1 is a schematic diagram of a conventional AGC control employed in an analog radio receiver.

Referring now to the drawings, wherein like numerals are used to refer to like elements throughout, there is shown in FIG. 1 a schematic diagram of a conventional analog high frequency (HF) radio receiver employing a well-known AGC control. As shown in FIG. 1, that front end portion of the radio receiver includes an antenna 12 coupled to a well-known variable gain radio frequency (RF) amplifier 14 coupled to amplify the received signal and provide an amplified output to a mixer 16. The mixer 16 receives the amplified output along with a local oscillator signal from the local oscillator 18 to produce an intermediate frequency (IF) signal which is provided as input to an IF filter 20. The IF filter 20 is generally a narrowband filter constructed to pass the desired range of intermediate frequency produced by the mixer 16 and provide that narrowband output to an intermediate frequency amplifier 22. The intermediate frequency amplifier 22 is a variable gain amplifier which provides the IF output at terminal 24 for demodulation and further processing of the received signal.

In such conventional receivers, the output from the IF amplifier is coupled through a conventional AGC circuit 26 which may be of the type as described in the aforementioned U.S. Pat. No. 4,263,560. The referenced circuit uses log-envelope detection of the IF signal to produce a linear gain control for the intermediate frequency input from filter 20 to thereby provide the automatic gain control of the analog system 10.

As will be appreciated from the above FIG. 1, because of the IF filter delay produced by element 20, the output from 24, which provides the signal as input to the AGC control 26, produces a delay in the response time at the RF amplifier 14 for controlling the gain of the signal applied to the mixer 16. Thus, the circuit will tend to overcompensate, overshoot or oscillate in response to gain changes, particularly to those caused by sudden gain changes at the input to amplifier 14. This results because the signal controlled at 14 at any given time is not that to which the AGC is related due to the delay produced by IF filter 20. As a result, the performance of the system is limited for strong signal changes, thus producing undesirable effects in the IF output at terminal 24 of the receiver.

While various forms of automatic gain control circuits have been proposed (such as that set forth in U.S. Pat. No. 3,620,631) for improving the response time of the automatic gain control circuits, the delay caused by the IF filter 20 in a conventional receiver system has still not been entirely overcome. Accordingly, even the improved AGC control systems still suffer from the inability to compensate for that delay to provide fast response and stable AGC control. This same requirement is necessary in the new generation of analog/digital receiving systems that are now being developed, since the same requirement for intermediate frequency filtering is present. In addition, there are other considerations related to the input necessary to drive the A/D converter at a satisfactory level in those analog/digital systems which must be addressed by any AGC control circuit employed.

Figure 2:
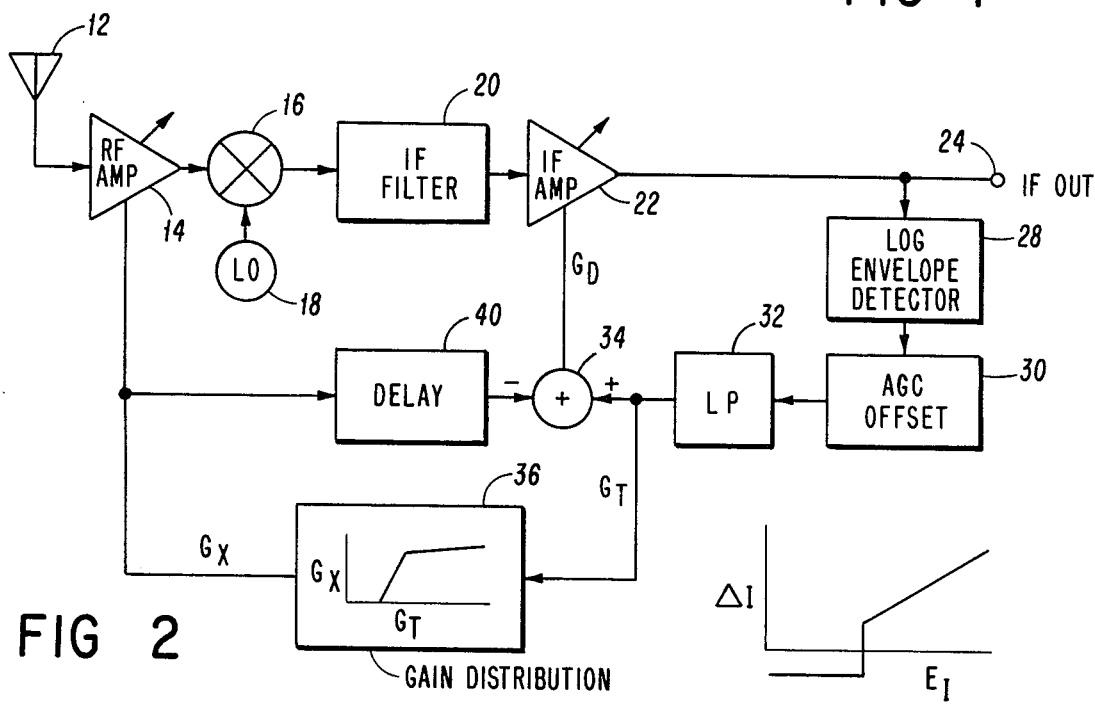
FIG. 2 is a schematic diagram showing the AGC circuit of the present invention implemented in a typical analog receiving system.

In accordance with the present invention, there is shown in FIG. 2 a dual loop AGC control circuit for improving the action of a high frequency receiver employing an AGC control. In particular, the system includes the antenna 12 for receiving a communication signal or other transmitted signal and for providing that received signal to the variable gain RF amplifier 14. The output of RF amplifier 14 is thence provided to mixer 16 where it is mixed with the output of local oscillator 18 to provide an intermediate frequency signal to IF filter 20. The output from filter 20 is in turn coupled to the variable gain IF amplifier 22 which provides the intermediate frequency output at terminal 24.

In accordance with the present invention, the IF output 24 is coupled to a conventional log envelope detector such as that shown in U.S. Pat. No. 4,263,560 to produce a logarithmic output from 28 representing the detected envelope at the output terminal 24. The logarithmic output from 28 is then coupled to an AGC offset circuit 30 having its output coupled through a conventional lowpass filter or integrator 32. The AGC offset is a conventional in-band AGC circuit which is constructed to prohibit an output from 30 until a certain signal level input has been received from the log envelope detector 28. The circuit is shown by a conventional input-output function below block 30, where $E_I$ represents the voltage output from the log envelope detector 28 and $\Delta I$ represents the corresponding output from 30 in response to that input. The exact points for that control function may be set to that desired for proper response depending upon the particular receiver design, but conventionally limits the AGC control signal until a certain minimum threshold has been received as an output through the logarithmic envelope detector 28.

After filtering (or integrating) at 32, the AGC control signal is coupled at one input to a summing circuit 34 having its output coupled to control the gain of the conventional IF amplifier 22. The output from 32 is also coupled to a gain distribution circuit 36 having its output coupled to control the gain of conventional RF amplifier 14. The output from 36 is also coupled through a compensating delay circuit 40 which has its output coupled as a second input to a conventional summer 34 where it is subtracted from the output from lowpass filter (integrator) 32.

The gain distribution circuit is constructed in a conventional fashion to produce an output after a predetermined threshold input to block 36 is reached. In particular, after that predetermined input, the gain at the output of 36 ($G_X$) will be proportionally related to the gain at the output of 32 ($G_T$) until it reaches a point where it is cut off and the gain $G_X$ is fixed. The compensating delay circuit 40 is likewise a conventional delay circuit which is constructed to have a delay equaling that of the delay characteristic of the IF filter 20 for the envelope of the IF signal. Thus, the DC characteristics of the compensating delay 40 are such that they are the same as the envelope delay of the IF filter. The circuit 40 can be conventionally implemented with a well-known transport delay circuit to provide the second input to be subtracted from the output of 32 in the summing circuit 34.

In accordance with the circuit of FIG. 2, the operation will be readily apparent. More particularly, the received signal at antenna 12 will be passed through the RF amplifier 14 and coupled to the mixer circuit 16 to produce the IF frequency which will be filtered at 20, and thus delayed in its application to the IF amplifier 22. The envelope output from terminal 24 will be detected and converted to a logarithm at 28 and, after the offset provided by circuit 30, and filtering (integrating) at 32, will be applied to one input of the summing circuit 34 which has its output coupled to the gain control of IF amplifier 22. Thus, upon receipt of the signal through the IF filter 20, the first primary AGC control loop including elements 28, 30, 32 and 34 will act to control the gain based solely on the signal output from IF filter 20.

At the same time, the automatic gain control signal from 32 is coupled through element 36 to the gain control of RF amplifier 14 to form the secondary control loop and control the gain of the input signal to mixer 16. The output of the automatic gain control signal from 32, as reflected at the output of distribution circuit 36, is then delayed by circuit 40 and provided as the second negative input to summing circuit 34. Thus, after the same delay as the IF filter 20, the output of 40 will be coupled and subtracted from the automatic gain control signal at 32 through summing circuit 34.

As will be appreciated, because of the delay produced by compensating circuit 40, the same signal that initially appeared at the output from 32 will be subtracted in the summing circuit 34 after the same time delay as that delay encountered in IF filter 20 to remove that signal and thus compensate for the effects of the delay caused by filter 20. Accordingly, and by way of example, if a sharp increase in the signal received appears at the output of IF filter 20 after the delay, the immediate reaction of the first control loop is to provide an AGC to IF amplifier 22, which will act to reduce the magnitude of the signal. At the same time, after a predetermined threshold through gain distribution circuit 36 has been achieved, the gain signal will act to control the magnitude of the received signal through RF amplifier 14 and thus reduce the magnitude of the signal supplied to the mixer 16 and accordingly the subsequent IF filter 20 and IF amplifier 22.

However, after a predetermined delay period, the same gain signal as was initially applied to IF amplfier 22 will appear at the output of compensating circuit 40 and be subtracted from the output at 32. This will substantially cancel its effect in the gain output at 32, to allow the gain of the IF amplifier 22 to reflect only that magnitude of the output 24 which is needed to respond to the current signal magnitude. Thus, the circuit provides the primary high speed AGC loop which responds instantaneously to the output of the IF filter, and a secondary loop which controls RF gain and provides a compensating delay for subtraction of the signal acquired from the primary high speed loop after the time delay equal to the IF filter.

Figure 3:
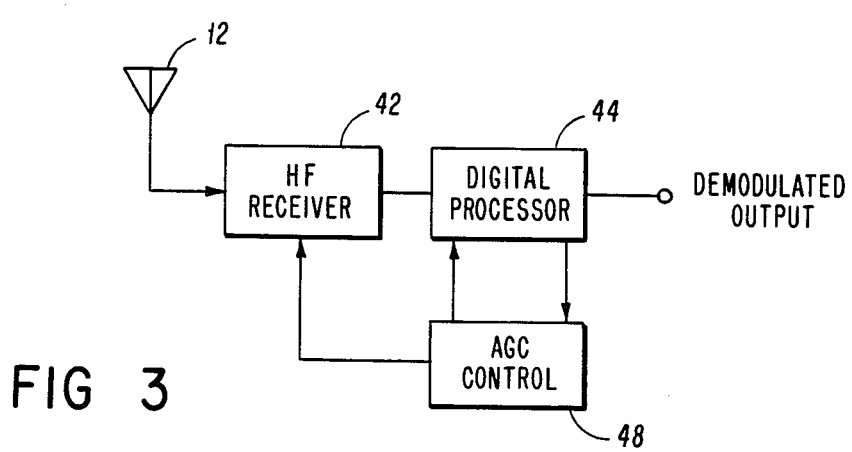
FIG. 3 is a schematic diagram showing an analog/digital receiving system employing an AGC circuit of the present invention.

Turning now to FIG. 3, there is shown a block diagram of an analog/digital receiver system using the AGC concepts shown in FIG. 2. The analog RF signal is supplied from the antenna 12 to a high frequency analog receiver 42 which conventionally includes the RF amplifier, mixer and analog IF filter as previously described. The analog receiver amplifies, filters and translates the frequency of the received signal until it is at an amplitude, bandwidth and frequency which is suitable for analog-to-digital conversion. Typically, for a high frequency receiver, the signal is amplified by a maximum of 60 dB, filtered to a 3 dB bandwidth of some 16 kHz and converted to a conventional IF center frequency of 2.8 MHz.

The analog IF signal from the HF receiver is then fed to the digital processing circuitry 44 which includes an A/D converter. By way of example, a 7 bit flash A/D converter of conventional construction can be used to sample this signal at a rate of Fs1 at 11.2 MHz and have an input voltage range of ±1.0 volt peak. The A/D converter may be constructed to have a fractional binary form with a range of ±1, and therefore a gain of 0 dB.

The sequence of digital words out of the A/D converter is then filtered to a narrow IF bandwidth and frequency translated as needed before being demodulated to reproduce the transmitted information. In this particular embodiment, the AGC is derived digitally since in order to provide the AGC signal from the analog receiver, it would be necessary to convert the gain reduction necessary for the digital signal processing by using an additional A/D converter. The only input signal for signal processing is therefore the intermediate frequency word sequence from the A/D converter. The digital outputs from the signal processor are thereafter the demodulated audio output and the gain control signal to the analog receiver. The AGC circuitry necessary for accomplishing that function is shown as circuit 48 in FIG. 3.

In accordance with the present invention, the analog receiver 42 provides gain prior to the A/D converter and translates the RF frequency to an intermediate frequency of 2.8 MHz and provides the required gain reduction in response to the digital AGC control signal from the digital signal processor 44 through AGC 48. The analog signal may have a gain of 60 dB which can be reduced to 0 dB by the digital AGC control signal. The analog receiver typically has a 13 dB noise figure and a 3 dB IF bandwidth of 16 kHz with a nominal delay associated with the wideband analog IF filter of 180 $\mu$seconds and an envelope rise time of 30 $\mu$seconds.

The digital gain control words from the digital processor 44 specify the gain reduction required in dB. The analog gain control corresponding to the digital word must cause the required gain reduction so that the proper output is acquired and the AGC response is independent of signal amplitude. In practice, in order to allow the output signal-to-noise ratio to grow with signal strength, the analog gain should not be decreased by AGC action until a signal-plus-noise to noise ratio of over 30 dB is obtained. As the signal level increases still further, the analog AGC should also hold the signal level to the A/D converter essentially constant until the gain control range of the analog receiver is exceeded. At that time, the digital gain control should take over to maintain a constant audio output signal level.

Figure 4:
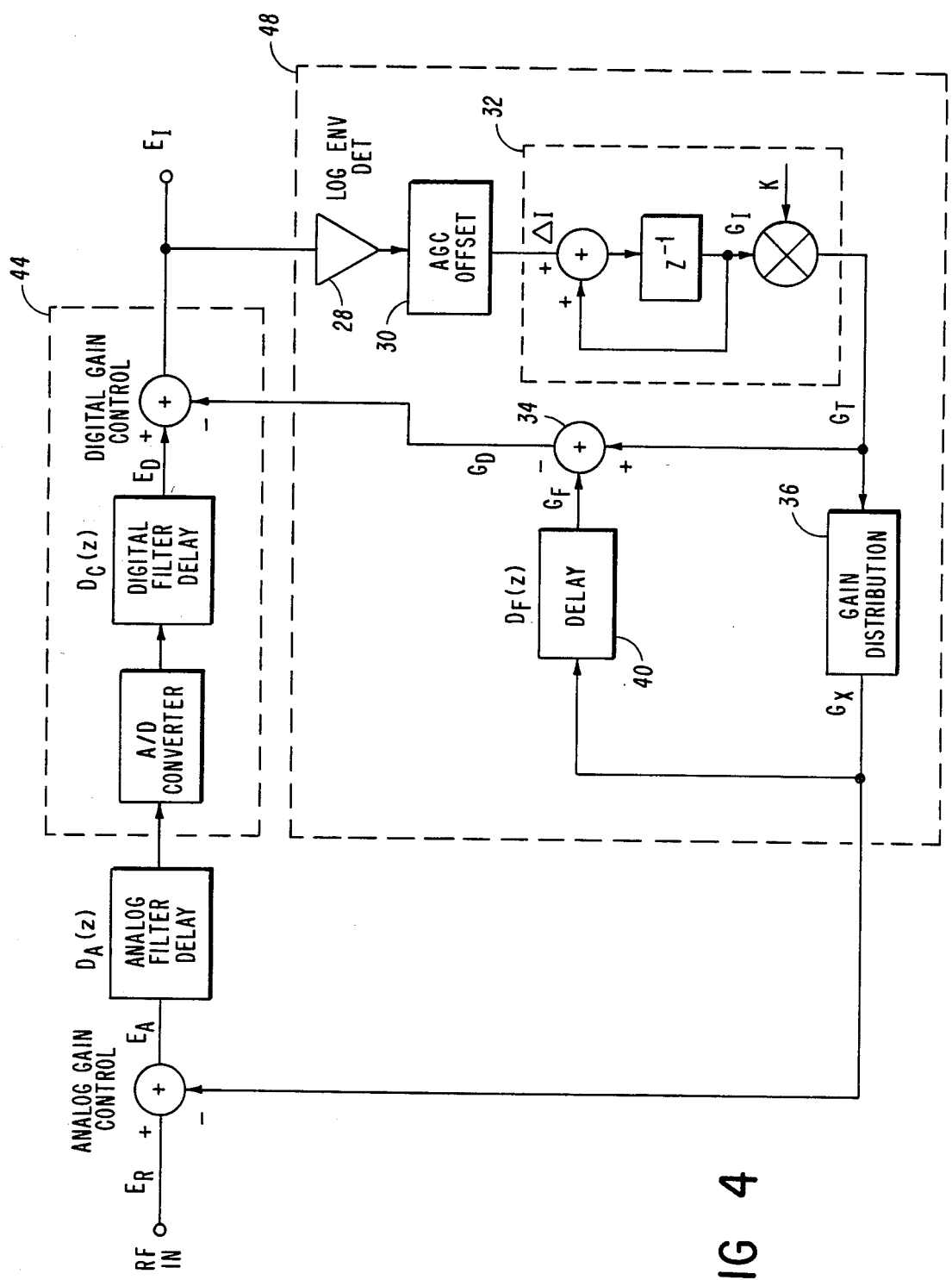
FIG. 4 is a detailed schematic diagram showing the mathematical/functional implementation and operation of the AGC in connection with the analog/digital receiving system.

Referring now to FIG. 4, there is shown an overall block diagram of the mathematical/functional relationships used in achieving the AGC control of the present invention. All gains and signal envelopes are referenced in dB so that the AGC system is modeled as a linear system except for AGC offsets (delays) and gain distribution curves. All linear transfer functions will be referred to as Z-transforms. In the case of IF and RF filters, transforms $D_A(z)$ and $D_C(z)$ are the RF/IF envelope impulse response of the filters, rather than the RF/IF voltage responses. Also, since all gains and envelopes are given in dBs, the gain control devices are represented as adders rather than multipliers, since the adding of logarithms produced by the circuits is equivalent to multiplication. In actual implementation, the gain control devices would multiply the RF/IF signals by the voltage gains and the envelope detectors would likewise output voltages rather than the dBs shown.

For purposes of illustration, let it be assumed that the AGC sampling rate Fs2 is 16 kHz and the required AGC attack time is 10 ms to recover within 0.5 dB for a 30 dB step in signal level. The analog IF filter has a nominal envelope delay of 187 μs and a typical rise time of 30 μs while the digital IF filter has a nominal IF delay of 2700 μs and a typical envelope rise time of 125 μs. The Z-transform of the analog IF filter envelope response $D_A(z)$ is therefore approximately given by:

$$D_A(z) = z^{-3}, \qquad (1)$$

and for the digital IF filter is:

$$D_C(z) = (\tfrac{1}{2})z^{-42}(z^{-1}z^{-2}) \qquad (2)$$

The steady state output envelope voltage should be maintained at a predetermined (33 dB) value below unity. This is accomplished as shown in FIG. 4 by the primary control loop considered in connection with the description below. After conversion to log in element 28, the output $E_I$ is coupled through the AGC offset to produce an output $\Delta I$. The transfer function for the AGC offset is:

$$\Delta I = E_I - D \text{ for } E_I \geq D \text{ (above threshold)} \qquad (3)$$
$$= -r \text{ for } E_I < D \text{ (below threshold)} \qquad (4)$$

where D is the AGC delay and r is an AGC release rate constant.

For a single loop AGC with a filter envelope delay $z^{-d}$ which represents delays in the signal envelope of d sample intervals, the AGC loop response is:

$$\frac{E_I(z)}{E_D(z)} = \frac{1 - z^{-1}}{1 - z^{-1} + K z^{-(d+1)}} z^{-d} \qquad (5)$$

For the primary or inner AGC loop of FIG. 4 with $d=0$, and with the secondary or outer loop disabled we have:

$$\frac{E_I(z)}{E_D(z)} = \frac{1 - z^{-1}}{1 + (K-1)z^{-1}} \qquad (6)$$

It can thus be seen that the loop will be stable for $-1 < K < 1$, where K is the loop gain constant. The z transform response to a unit step is:

$$u(z) = \frac{1}{1 - z^{-1}} \qquad (7)$$

$$\frac{E_I(z)}{E_D(z)} u(z) = \sum_{n=0}^{\infty} (1-K)^n z^{-n} \qquad (9)$$

and the output sample sequence would be:
1, $(1-K)$, $(1-K)^2$, $(1-K)^3$ ... $(1-K)^n$.
In order for the output envelope to decay to a value of 1/60 of the input step from +30 to +0.5 dB in 10 ms or 160 sample times, then K must be 1/32.

For values below the AGC threshold, the gain is increased by r/K dB every sample period. For a release rate of 10 dB/second and a sample rate of 16,000 samples per second, the required value of r is 0.02 dB. For an envelope delay of one sample period ($d=1$), the loop is stable for $0 < K < 1$. The poles are thus real for $0 < K < \tfrac{1}{4}$, and at $K = \tfrac{1}{4}$ both poles are at $z = \tfrac{1}{2}$. If a narrowband IF filter is included in the AGC loop the delay will be 2700 μs or $d=43$. With such large delays the output integrator does not see the effects of gain changes until long after the changes are made and the loop becomes oscillatory. These instabilities can be overcome by slowing down the AGC response, but then the AGC attack time requirements cannot be met. It is therefore desirable to avoid any filter delay in the primary or output AGC loop.

In order to exercise AGC control over the analog portion of the receiver to avoid overload without introducing instabilities or decreasing attack time, the secondary or outer loop of the circuit of FIG. 4 has been implemented. It can be seen that when the overall gain reduction voltage $G_T$ exceeds the lower threshold of the gain distribution voltage transfer function, the entire change in $G_T$ is applied to the receiver AGC gain control point. This causes a reduction in the receiver gain equal to the full amount of the required change. However, the change in signal envelope will not be seen in the output until after the delay introduced by $D_A(z)$ and $D_C(z)$. Therefore, the gain change is also applied directly to the digital AGC control point (through adder 34) in order to reduce the output immediately.

If the gain reduction at the digital AGC control point were maintained, however, then there would be gross over-control once the signal envelope had passed through the IF filter delays, $D_A(z)$ and $D_C(z)$. In order to avoid this problem, the analog receiver gain reduction voltage $G_X$ is delayed by a filter delay element $D_F(z)$ to obtain a delayed gain reduction voltage $G_F$. This gain reduction voltage is subtracted from $G_T$ to obtain $G_D$. If the IF filter envelope delay function $D_C(z)$ plus the analog filter delay $D_A(z)$ are equal to the feedback gain reduction delay function $D_F(z)$, then the digital gain reduction voltage $G_D$ will be decreased by the proper amount at the instant that the attenuated envelope arrives at the digital AGC point. Thus, if the delay functions $D_C(z)$ plus $D_A(z)$ can be adequately matched to equal $D_F(z)$ (and provided that the analog receiver gain reduction adequately follows the gain reduction digital word) then the AGC loop behaves as a simple loop and the envelope delays $D_C(z)$ and $D_A(z)$ have no effect on the overall response loop. Additionally, if the analog receiver envelope introduces envelope limiting, then matching limiting should be introduced into $D_F(z)$.

All of the functions except the analog receiver gain control can be implemented in the digital signal processor. The function $D_F(z)$ is the product of $D_A(z)$ and $D_C(z)$, or a typical delay of forty-six 16,000 Hz sample periods followed by a FIR filter with two equal taps of weight $\tfrac{1}{2}$. With respect to the gain distribution circuit 36, the required gain distribution is constructed such that the receiver gain reduction is zero until a total gain ($G_T$) reduction of 30 dB has been reached. At that time there is a linear relationship between total gain ($G_T$) reduction and analog receiver gain ($G_R$) reduction in dB such that there is a 90 dB total gain ($G_T$) reduction for a 60 dB analog gain ($G_X$) reduction. At this point, for any increase in the total gain $G_T$ reduction, there is a constant 60 dB analog gain ($G_X$) reduction.

In implementing the above controls, the schematic diagram of FIG. 4 is shown generally to represent well-known functions that can be digitally implemented. By way of example, the AGC quantities for the loop can represent a logarithmic measure of the signal envelope or the voltage gain. This can be expressed in binary terms and converted to a voltage gain or voltage multiplier in accordance with conventional techniques. The log envelope detector can likewise be implemented in a conventional form to obtain the required digital representation of the gain control signal. The gain of the analog receiver is typically controlled over a range of 60 dB by the gain reduction word $G_X$. The digital word can directly control digital attenuators or an analog AGC voltage by means of a PROM look-up table and D/A converter.

In connection with the in-band AGC offset, the in-band AGC integrator should only start to initiate a gain reduction when the log envelope exceeds an output level of 30 dB below 1 volt. If the log envelope is greater than $-30$ dB below one volt, then the sample output $\Delta I$ to the in-band AGC integrator 32 should be $\Delta I = E_I + 30$ in dB. On the other hand, if the log envelope is less than $-30$ dB below one volt, then a small decrement should be made to the in-band AGC integrator 32 to decrease the gain. Such integration can be implemented using conventional accumulators or integrators in conventional fashion.

Obviously, many other modifications and variations of the invention are possible in light of the above teachings. It is therefore to be understood that within the scope of the appended claims, the invention may be practiced otherwise than as specifically described.

What is claimed is:

1. An automatic gain control circuit comprising:
   means for providing a first automatic gain control signal;
   means for receiving said first automatic gain control signal and providing a delayed output of that first automatic gain control signal; and
   means for subtracting said delayed automatic gain control signal from said first automatic gain control signal to produce a second automatic gain control signal.

2. The circuit of claim 1 wherein said means for providing a first automatic gain control signal comprises a log-envelope detector for receiving a signal and providing a logarithmic output representing a detected envelope of that signal and means for low pass filtering said logarithmic output to provide said first automatic gain control signal.

3. The circuit of claim 2 further including means for offsetting said logarithmic output.

4. An automatic gain control system comprising:
   first means for varying the gain of an input signal to provide an first output signal in response to a first automatic gain control signal;
   means for delaying said first output signal;
   second means for varying the gain of said delayed first output signal to provide a second output signal in response to a second automatic gain control signal;
   means responsive to said second control signal for providing a first automatic gain control signal;
   means for delaying said first automatic gain control signal for providing a delayed first automatic gain control signal; and
   means for subtracting said delayed first automatic gain control signal from said first automatic gain control signal to provide a second automatic gain control signal.

5. The system of claim 4 wherein said means for providing said first automatic gain control signal comprises a log-envelope detector coupled to receive said second output signal and provide a logarithmic value of a detected envelope of that second output signal, and a lowpass filter coupled to lowpass filter said logarithmic value to provide said first automatic gain control signal.

6. The system of claim 4 wherein said means for delaying said first automatic gain control signal has a delay equal to the delay of said means for delaying said first output signal.

7. The system of claim 4 wherein said first means for varying the gain and said second means for varying the gain are each variable gain amplifiers.

8. The system of claim 4 wherein said input signal has a frequency and further including means for translating the frequency of said first output signal to another frequency.

9. The system of claim 4 wherein said input signal is a radio frequency signal, said first means is a radio frequency amplifier, said second means is an intermediate frequency amplifier, and said means for delaying said first output signal is an intermediate frequency filter, said system further including means for translating said first output signal from a radio frequency signal to an intermediate frequency signal.

10. In a receiving system having a variable gain radio frequency amplifier coupled to receive a radio frequency input signal and provide a radio frequency output signal having a gain which varies in response to a first control signal, a means for translating said radio frequency output signal to an intermediate frequency, an intermediate frequency filter coupled to filter said intermediate frequency and provide an intermediate frequency filter output, and a variable gain intermediate frequency amplifier coupled to receive said filter output and provide an intermediate frequency output signal having a gain which varies in response to a second control signal, the improvement in said system comprising:
   means coupled to receive said variable intermediate frequency output signal to provide a first automatic gain control signal, said first automatic gain control signal being coupled as said first control signal;
   means for delaying said first automatic gain control signal to provide a delayed first automatic gain control signal; and
   means for subtracting said delayed first automatic gain control signal from said first automatic gain control signal to provide a second automatic gain control signal as said second control signal.

11. The system of claim 10 wherein said intermediate frequency filter has a delay and said means for delaying has a delay which is equal to the delay of said intermediate frequency filter.

* * * * *